(12) United States Patent
Mämmilä

(10) Patent No.: US 9,962,790 B2
(45) Date of Patent: May 8, 2018

(54) CIRCUIT BOARD SUPPORT FOR LASER CUTTING

(75) Inventor: Tuomo Mämmilä, Kempele (FI)

(73) Assignee: JOT AUTOMATION OY, Oulu (FI)

( * ) Notice: Subject to any disclaimer, the term of this patent is extended or adjusted under 35 U.S.C. 154(b) by 318 days.

(21) Appl. No.: 13/881,329

(22) PCT Filed: Oct. 19, 2011

(86) PCT No.: PCT/FI2011/050911
§ 371 (c)(1),
(2), (4) Date: Dec. 9, 2013

(87) PCT Pub. No.: WO2012/056097
PCT Pub. Date: May 3, 2012

(65) Prior Publication Data
US 2014/0091072 A1    Apr. 3, 2014

(30) Foreign Application Priority Data

Oct. 25, 2010   (FI) ...................................... 20106100

(51) Int. Cl.
  *B21J 13/08*      (2006.01)
  *B23K 26/38*     (2014.01)
  *B23K 26/08*     (2014.01)
  *H05K 13/00*     (2006.01)
  *B23K 26/70*     (2014.01)

(52) U.S. Cl.
  CPC .......... *B23K 26/38* (2013.01); *B23K 26/0838* (2013.01); *B23K 26/702* (2015.10); *H05K 13/0069* (2013.01)

(58) Field of Classification Search
  CPC ........ B23K 26/00; B23K 26/04; B23K 26/40; B23K 37/04

USPC ................... 219/158, 121.6, 121.61
See application file for complete search history.

(56) References Cited

U.S. PATENT DOCUMENTS

| 2,796,843 | A | | 6/1957 | Kleppinger |
| 3,688,080 | A | | 8/1972 | Cartwright et al. |
| 5,814,532 | A | * | 9/1998 | Ichihara ........................ 438/33 |
| 5,817,396 | A | * | 10/1998 | Perlo ...................... G02B 1/11 |
| | | | | 136/256 |
| 6,270,392 | B1 | * | 8/2001 | Hayashi ............... B24B 37/105 |
| | | | | 451/10 |
| 6,518,502 | B2 | * | 2/2003 | Hammond et al. ........... 174/535 |

(Continued)

FOREIGN PATENT DOCUMENTS

| CN | 101406988 A | 4/2009 |
| DE | 102006036500 | 2/2008 |

(Continued)

OTHER PUBLICATIONS

Pengfei Wang, Chinese Search Report for corresponding Chinese Patent Application No. 201180056822.6, pp. 1-2 (dated Sep. 2, 2014).

(Continued)

*Primary Examiner* — Dana Ross
*Assistant Examiner* — Ayub Maye
(74) *Attorney, Agent, or Firm* — Hoffmann & Baron, LLP

(57) ABSTRACT

A support comprises a ceramic supporting surface, on which a circuit board may be placed for cutting to be performed by means of optical radiation generated by a laser. The ceramic supporting surface remains unchanged as said laser radiation hits it.

9 Claims, 3 Drawing Sheets

(56) References Cited

U.S. PATENT DOCUMENTS

| | | | |
|---|---|---|---|
| 6,583,383 B2* | 6/2003 | Higashi et al. | 219/121.72 |
| 6,739,047 B2* | 5/2004 | Hammond et al. | 29/847 |
| 6,967,722 B2* | 11/2005 | Manning | G01J 3/453 |
| | | | 356/452 |
| 7,134,943 B2* | 11/2006 | Nagai et al. | 451/41 |
| 7,208,346 B2* | 4/2007 | Lee | 438/110 |
| 7,232,741 B2* | 6/2007 | Nagai et al. | 438/460 |
| 8,822,882 B2* | 9/2014 | Liu et al. | 219/121.69 |
| 2003/0180127 A1* | 9/2003 | Kuroda | H01L 21/681 |
| | | | 414/217 |
| 2004/0029362 A1 | 2/2004 | Liu | |
| 2004/0087112 A1 | 5/2004 | Liu | |
| 2005/0082644 A1* | 4/2005 | Ohkawa | B23K 26/0057 |
| | | | 257/628 |
| 2005/0158968 A1 | 7/2005 | Nagai | |
| 2008/0042227 A1* | 2/2008 | Asano | H01L 27/14618 |
| | | | 257/432 |

FOREIGN PATENT DOCUMENTS

| | | |
|---|---|---|
| EP | 1847350 | 10/2007 |
| JP | 2008023577 | 2/2008 |
| WO | 9812055 | 3/1998 |
| WO | 0051778 | 9/2000 |

OTHER PUBLICATIONS

Finnish Office Action and Search Report, pp. 1-6.
International Search Report and Written Opinion, dated Feb. 9, 2012, pp. 1-17.
Malaysian Search Report for corresponding Malaysian Application No. PI 2013001470, p. 1, dated Sep. 13, 2016.

* cited by examiner

CIRCUIT BOARD SUPPORT FOR LASER CUTTING

CROSS-REFERENCE TO RELATED APPLICATION

This application is a National Stage application of International Application No. PCT/FI2011/050911, filed Oct. 19, 2012, which claims priority to Finnish Application No. 20106100, filed Oct. 25, 2010, which is incorporated by reference herein in its entirety.

BACKGROUND

Field

The invention relates to a support for laser cutting of a circuit board.

Description of the Related Art

Circuit board material, such as FR4 circuit board, may be cut by directing laser-generated optical energy onto a circuit board at a power necessary for cutting. Laser radiation is focused onto a circuit board as a small point, whereby in the focal point area the circuit-board substance heats intensely and detaches. Detachment may result from melting, burning, evaporating or the like. Detachment may be enhanced by pressurized air or gas, for instance. Laser cutting allows board parts of electronic circuitry, printed or to be printed on a circuit board module, to be detached from a large circuit board and each circuit board part may be shaped to have a desired form. Each circuit board part may comprise the same electronic circuit, or different circuit board parts may comprise different electronic circuits. Laser cutting provides a clean and precise cut on the circuit board without fouling and wearing a cutting edge.

For cutting, the circuit board is placed on a support, which may be product-specific for each circuit board part. As the support is shaped according to a board part to be produced, laser radiation does not hit the support, and thus damage to the support is avoided.

Attempts have been made to avoid damages caused by laser radiation to the support by employing a belt or slat-type conveyor support, which does not come into contact with the circuit board at the focal point of laser radiation. It is possible to implement the solution, for instance, by means of three rolls such that the middle roll is on the support, and lower than the other two rolls, whereby the roll protects the support while the roll and support location further off the focal point reduces the laser radiation force exerted thereon per surface area unit.

Laser cutting of circuit boards poses problems, however. A problem with a product-specific support solution is that each circuit board to be produced must have a specific support, which makes the cutting arrangement complicated, expensive and prone to fault situations. In the belt and slat-type conveyor, where the support does not come into contact with the circuit board, the problem is that roll locations must be changed along with laser radiation focusing, when the circuit board is being cut. In that case the circuit board may move and the laser radiation may hit a point other than intended. Furthermore, because it is difficult to make the rolls very small, and they do not permit formation of a narrow slit equal to the focal point of laser radiation, the circuit board to be cut may bend at the cutting point and thus becomes off focus, which distorts the cutting direction and deteriorates both the alignment and the cut. Thus there is a need to develop a support to be used in laser cutting.

SUMMARY

It is an object of the invention to provide an improved support. This is achieved by a support for carrying a circuit board.

The invention relates to a support for carrying a circuit board during cutting performed by laser radiation. The support comprises a ceramic supporting surface, on which the circuit board may be placed for cutting to be performed by laser-generated optical radiation, the ceramic supporting surface being configured to remain unchanged as said laser radiation hits it.

The invention also relates to a method for supporting a circuit board during cutting performed by laser radiation. In the method the circuit board is supported by a ceramic supporting surface of the support and optical radiation from the laser which cuts the circuit board is received on the ceramic supporting surface of the support without non-reversible changes in the supporting surface.

Preferred embodiments of the invention are disclosed in the dependent claims.

The method and performance measurement system of the invention provide several advantages. The support is not product-specific and it withstands laser cutting.

BRIEF DESCRIPTION OF THE DRAWINGS

The invention will now be described in greater detail in connection with preferred embodiments, with reference to the accompanying drawings, in which.

DETAILED DESCRIPTION

Figure 1:
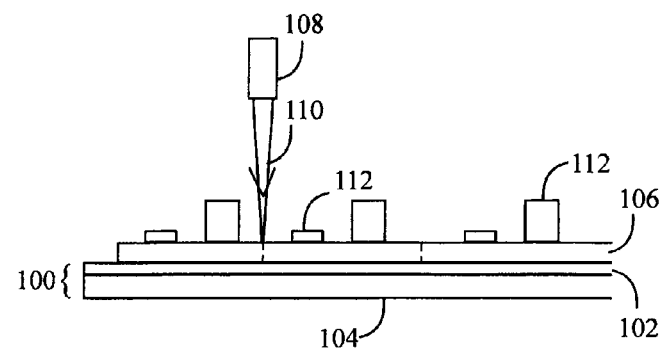
FIG. 1 shows cutting of a circuit board by laser.

FIG. 1 shows how a circuit board is cut by means of laser radiation. The circuit board 106 may comprise components 112 or the circuit board 106 may be without components. The components 106 may be electronic, optical, optoelectronic, mechanical or the like, without being restricted thereto, however. The circuit board 106 may comprise an FR4 laminate or other circuit board material used in electronic circuit manufacture. Thus, the circuit board 106 may also be flexible, such as FPC (Flexible Printed Circuit).

A support 100, which is at least approximately horizontal such that the circuit board 106 will stay in place without sliding on the support 100 by means of friction, may be completely ceramic, in which case it has a ceramic supporting surface 102 against the circuit board 106 to be placed on the support 100, or it may comprise a separate ceramic supporting surface 102, on which the circuit board 106 may be placed. In that case the other material 104 in the support 100 below the ceramic supporting surface 102 may be metal. Metal enhances impact resistance of the support 100, for instance. Instead of metal, the other material 104 may also be plastic. In addition, the other material 104 may be a combination of various materials.

The supporting surface 102 of the support 100 is ceramic so that the circuit board 106 could be safely cut by means of the optical radiation 110 generated by the laser 108. The laser 108 may be a carbon dioxide laser ($CO_2$ laser), a neodymium laser (Nd laser), a neodymium-doped yttrium aluminium garnet laser (Nd YAG laser) or the like. In principle, optical radiation 110 the laser 108 emits may be ultraviolet light, visible light or infrared light. In many cases, the radiation emitted by the laser 108 is infrared and within the range of 1 µm to 20 µm, for instance. The carbon dioxide laser, for instance, may operate at the wavelength of about 10 µm. The optical radiation 110 of the laser 108 may be focused onto the circuit board 106 as a focal point whose diameter may be just tenths or hundredths of millimeters, without limiting thereto, however.

The optical radiation generated by the laser 108 cuts a hole in the circuit board 106 and as the focal point of the optical radiation 110 is moved in relation to the circuit board 106, circuit board parts of desired shape may be cut off the circuit board 106. The ceramic supporting surface 102 remains unchanged, however, even though the laser radiation 110 hits it. So, the ceramic supporting surface 102 withstands possible focussing of energy originating from the laser radiation 110 and a resulting rise in temperature without breaking and deforming permanently. For instance, a minor change caused by thermal expansion is fully reversible. The material of the supporting surface 102 withstanding optical radiation of the laser 108 may be porcelain, for instance. Alternatively or additionally, the supporting surface 102 may be of herlite and/or burnt clay.

From the supporting surface 102 optical radiation generated by the laser 108 may reflect and/or scatter towards the circuit board 106. The supporting surface 102 may, however, damp the reflected/scattered laser radiation 110 so much that the optical radiation from the support to the circuit board 106 will not alter or damage the circuit board 106. The damping is based, for instance, on the roughness of the supporting surface 102, which affects the scattering, and on the reflection coefficient, which affects the intensity of reflection, on the wavelength range used by the laser 108. Sufficiently high scattering and/or reflection dampening are thus useful.

In some cases a randomly selected, ceramic supporting surface material is sufficiently good. Sometimes the supporting surface material is to be optimised according to the optical radiation power used in cutting and the strength of the circuit board material to be cut. The supporting surface 102 may thus be strongly scattering at the wavelength of the laser, which is provided by unevenness exceeding the wavelength in the surface. Average roughness may thus be inferior to the size (e.g. diameter) of the focal point in the optical radiation 110 of the laser 108. Further, average roughness of the supporting surface may be superior to the wavelength in the optical radiation 110 of the laser 108. Thus, the average roughness in the supporting surface 102 may range from ten micrometers up to millimeters, if the laser wavelength is about 10 micrometers. In addition, the supporting surface 102 may reflect poorly the optical radiation 110 of the laser 108. In that case, the supporting surface 102 may reflect only less than half of the optical radiation 110 of the laser 108 directed thereto, for instance. With appropriate choices of material the supporting surface 102 may also be rendered so poorly reflective that the reflection is just from a few per mille to a few tens of percent of the optical radiation 110 of the laser 108 directed to the supporting surface 102.

Figure 2:
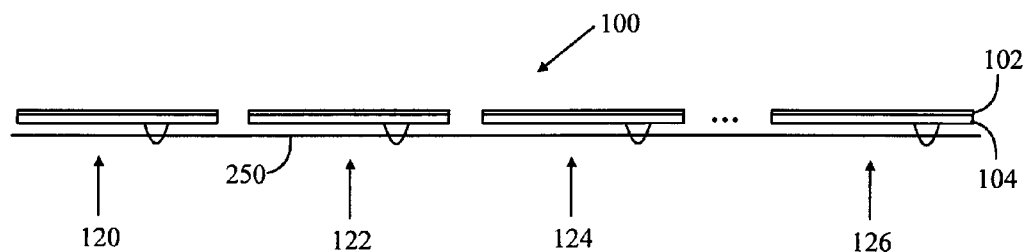
FIG. 2 shows a support comprising a plurality of support parts.

FIG. 2 shows an embodiment in which the support 100 comprises a plurality of support parts 120 to 126 which may be separate or interconnected. Each support part 120 to 126 comprises, however, a ceramic supporting surface 102. The support 100 may be e.g. a slat-type conveyor, whose slats may be connected to a movable chain 250. The slat-type conveyor permits a horizontal turn of desired degree and thus the support 100 of the slat-type conveyor may also rotate in a horizontal circle. The slat-type conveyor may be intended to transfer circuit boards 106 for being cut with the laser 108. On the circuit boards 106 the components may be in place, and consequently the circuit board 106 may be ready for service.

Figure 3:
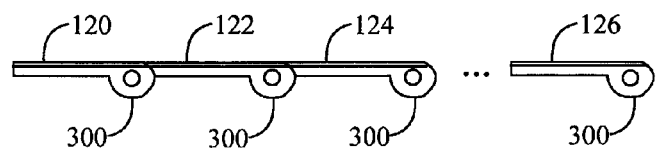
FIG. 3 shows support parts with pivot-type interconnection.

FIG. 3 shows a support consisting of support parts 120 to 126. The support parts 120 to 126 of the support 100 may be interconnected with pivots 300.

Figure 4:
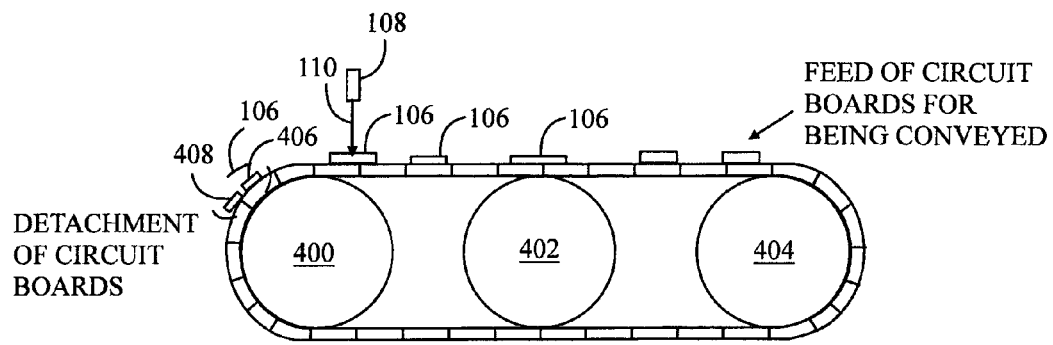
FIG. 4 is an example of a conveyor.

FIG. 4 shows a conveyor whose part serving as the support 100 is circular in vertical direction. The support 100 may rotate endlessly between end rolls 400, 404 and move circuit boards 106 supplied to the support 100 for being cut by the optical radiation 110 of the laser 108. There may be more than two rolls 400, 402, 404, whereby the support 100 may also be carried between the end rolls 400, 404. Also in this case the conveyor support 100 comprises a ceramic supporting surface 102, which comes into contact with the circuit board 106. Further, the support 100 may comprise support parts 120 to 126, which may be pivotedly interconnected, as shown in FIG. 3, in order to enable the support 100 to curve along with the surface of the rolls 400, 404. After the cut performed by the laser 108, the circuit board parts 406, 408 cut off the circuit board 100 may be transferred from the support 100 to a desired place or for further processing.

Figure 5A:
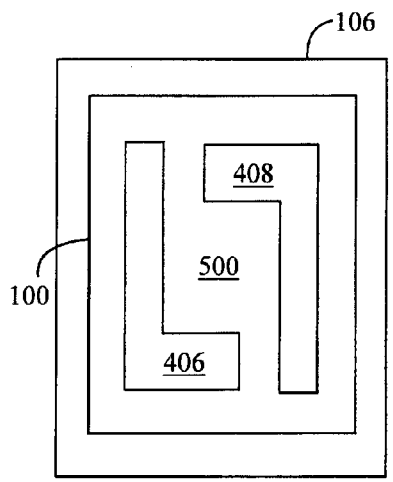
FIG. 5A shows a circuit board on the support.

FIG. 5A shows a circuit board 106 which lies on a support 100 and where circuit board parts to be cut 406, 408 are marked. An edge portion not belonging to the circuit board parts 406, 408 of the circuit board 100 is indicated by reference numeral 500.

Figure 5B:
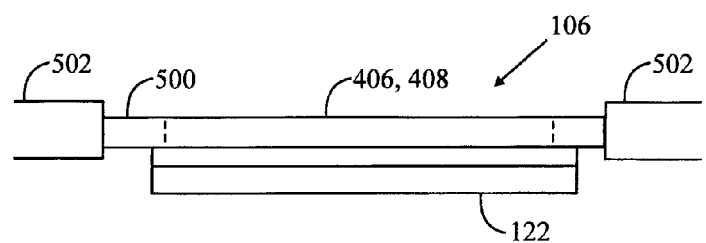
FIG. 5B shows a situation, in which the circuit board with its support is lifted at the cutting height, where laser radiation may cut the circuit board.
Figure 5C:
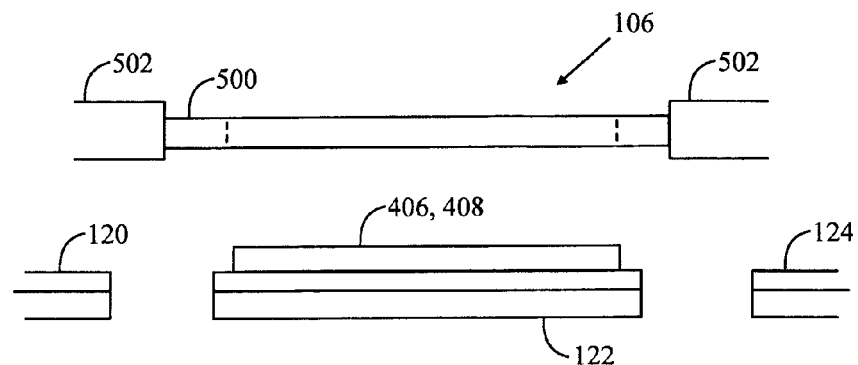
FIG. 5C shows a situation, in which the cut circuit boards are lowered on the support from the cutting height.

FIGS. 5B and 5C show the principle how the circuit board parts 406, 408 are separated from the rest of the circuit board after cutting. FIG. 5B shows an embodiment, in which each support part 120 to 126, such as a slat, may be detached and lifted for the cutting process. This conveyor may be a pallet conveyor, for instance, and the lifting may be performed by means of pressurized air generated by a pneumatic cylinder. Instead of the pneumatic cylinder, it is also possible to use other lifting mechanisms. After lifting, when the circuit board 106 is up, the circuit board 106 may be set accurately onto a predetermined place with holders 502 for being cut. Three holders 502 may, for instance, press the circuit board 106 such that the circuit board 106 remains in place. How the circuit board 106 will be held in place during cutting (or whether it will be held at all) is not relevant to this application.

FIG. 5C shows a situation, in which the support part 120 (or any one of the support parts 122 to 126) is lowered back to the level of other support parts. In that case the circuit board parts 406, 408 have come down together with the support part 120, but the edge portion 500 of the circuit board 106 is still up in the holder 502. The edge portion 500 may be shifted from the holder 502 for disposal or recycling. After cutting, the support part 120 moves onwards so that a next circuit board 106 on a next at least one support part 122 to 126 can be cut.

Figure 6:
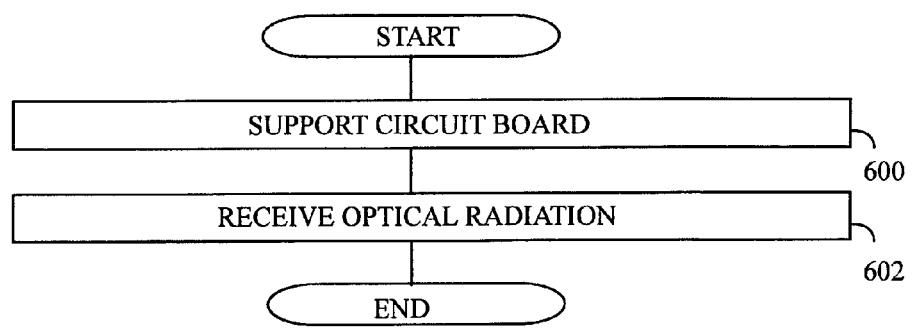
FIG. 6 is a flow chart of the method.

FIG. 6 is a flow chart of the method. In step 600, the circuit board 102 is carried on a ceramic supporting part 102 of the support 100. In step 602, optical radiation 110 of the laser 108 cutting the circuit board 102 is received on the ceramic supporting surface 102 of the support 100 without non-reversible changes in the supporting surface 102.

Even though the invention is described above with reference to the attached drawings, it is clear that the invention is not restricted thereto, but it may be modified in a variety of ways within the scope of the accompanying claims.

The invention claimed is:

1. A support for carrying a circuit board, the support comprising: a plurality of pivotally interconnected support parts, each of the plurality of pivotally interconnected support parts configured to be connected to each other to form a conveyer, each of the plurality of pivotally interconnected support parts being detachable for lifting the detached support part having the circuit board thereon for a cutting process, each of the plurality of pivotally interconnected support parts comprising:
  a ceramic supporting surface on which the circuit board is placed for being cut by optical radiation generated by a laser in conjunction with the cutting process, the ceramic supporting surface being configured to remain unchanged in response to said optical radiation hitting the ceramic supporting surface, the ceramic supporting surface being configured to damp an intensity of reflection of the optical radiation by selecting at least one of a roughness and a reflection coefficient associated with the ceramic supporting surface, thereby avoiding alteration or damage to the circuit board, an average roughness associated with the ceramic supporting surface being less than a focal point size associated with the laser and being greater than a wavelength associated with the laser, and wherein the plurality of pivotally interconnected support parts are interconnected with pivots, thereby enabling the support to curve along with a surface of rolls.

2. The support of claim 1, wherein each of the plurality of pivotally interconnected support parts comprises metal on top of the ceramic supporting surface.

3. The support of claim 1, wherein the plurality of pivotally interconnected support parts is connected to a movable chain.

4. The support of claim 3, wherein the support is a slat-type conveyor that transfers circuit boards for being cut by the laser.

5. The support of claim 1, wherein the ceramic supporting surface of the support comprises herlite.

6. The support of claim 1, wherein at least one of optical radiation associated with the laser; a strength of the circuit board, and the wavelength associated with the laser is selected to increase scattering of the laser.

7. The support of claim 1, wherein an unevenness and roughness associated with the ceramic supporting surface is configured to be greater than a wavelength associated with the laser.

8. A method for supporting a circuit board, wherein the method comprises: carrying the circuit board on a support, the support comprising:
  a plurality of pivotally interconnected support parts, each of the plurality of pivotally interconnected support parts configured to be connected to each other to form a conveyer, each of the plurality of pivotally interconnected support parts being detachable for lifting the detached support part having the circuit board thereon for a cutting process, each of the plurality of pivotally interconnected support parts comprising a ceramic supporting surface;
  receiving optical radiation of a laser cutting the circuit board on the ceramic supporting surface of the support without non-reversible changes in the ceramic supporting surface; and
  damping, by the ceramic supporting surface, an intensity of reflection of the optical radiation by selecting at least one of a roughness and a reflection coefficient associated with the ceramic supporting surface, thereby avoiding alteration or damage to the circuit board, an average roughness associated with the ceramic supporting surface being less than a focal point size associated with the laser and being greater than a wavelength associated with the laser, and wherein the plurality of pivotally interconnected support parts are interconnected with pivots, thereby enabling the support to curve along with a surface of rolls.

9. The method of claim 8, wherein the ceramic supporting surface of the support comprises herlite.

* * * * *